(12) United States Patent
Kamiguchi

(10) Patent No.: US 7,974,083 B2
(45) Date of Patent: Jul. 5, 2011

(54) DISPLAYING APPARATUS

(75) Inventor: Kinya Kamiguchi, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/391,751

(22) Filed: Feb. 24, 2009

(65) Prior Publication Data

US 2009/0225505 A1 Sep. 10, 2009

(30) Foreign Application Priority Data

Mar. 10, 2008 (JP) .................................. 2008-059477

(51) Int. Cl.
*H05K 5/00* (2006.01)
*H05K 7/00* (2006.01)
(52) U.S. Cl. .......... 361/679.21; 361/679.22; 361/679.26
(58) Field of Classification Search ............. 361/679.21, 361/679.22, 679.26
See application file for complete search history.

(56) References Cited

U.S. PATENT DOCUMENTS

| 7,150,804 B2 | 12/2006 | Tajima | 156/344 |
| 2003/0117063 A1 | 6/2003 | Tajima | 313/495 |
| 2006/0187644 A1* | 8/2006 | Jeong | 361/704 |
| 2006/0291153 A1* | 12/2006 | Bae | 361/681 |
| 2009/0154077 A1 | 6/2009 | Kamiguchi | 361/679.01 |

FOREIGN PATENT DOCUMENTS

| JP | 2003-288028 | 10/2003 |
| JP | 2006-098735 A | 4/2006 |

* cited by examiner

*Primary Examiner* — Jayprakash N Gandhi
*Assistant Examiner* — Anthony M Haughton
(74) *Attorney, Agent, or Firm* — Fitzpatrick, Cella, Harper & Scinto

(57) ABSTRACT

A displaying apparatus includes a displaying panel having a plane and being surrounded by an external margin of the displaying panel, with the plane comprising a central region closer to a center position of the displaying panel than the external margin and a peripheral region positioned between the external margin and the central region, and a support member supporting the displaying panel by having a first portion opposing the central region and a second portion opposing the peripheral region. In addition, an adhesive member is provided between the displaying panel and the support member, with the plane being bonded to the support member by the adhesive member, and a cushion material is provided between the displaying panel and the support member. The plane of the displaying panel is bonded to the first portion by the adhesive member only at its central region, and the cushion material is provided between the peripheral region of the plane and the second portion.

18 Claims, 4 Drawing Sheets

IN HIGH TEMPERATURE STATE

IN HIGH TEMPERATURE STATE

IN LOW TEMPERATURE STATE

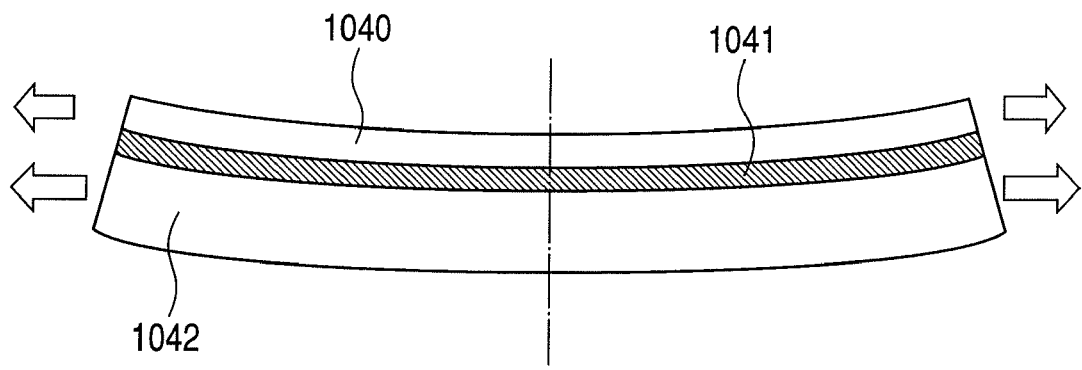
IN HIGH TEMPERATURE STATE
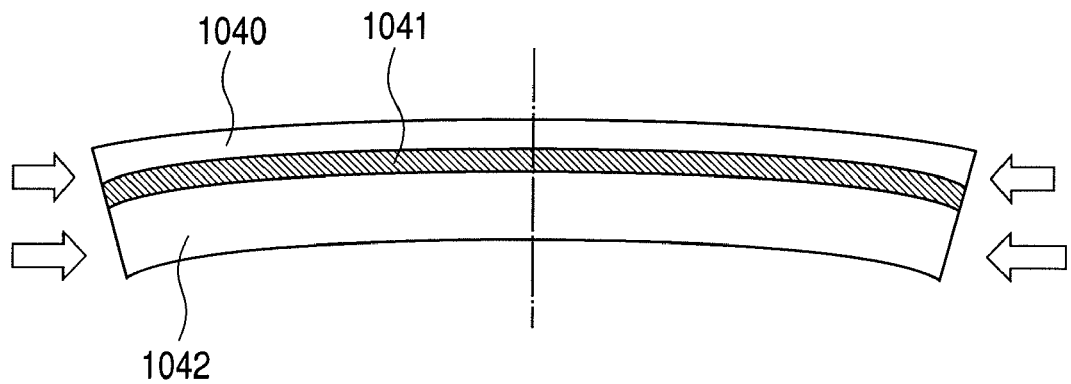
IN LOW TEMPERATURE STATE

DISPLAYING APPARATUS

BACKGROUND OF THE INVENTION

1. Field of the Invention

The present invention relates to a displaying apparatus which comprises a displaying panel and a support member for supporting the displaying panel, wherein the displaying panel and the support member are adhered by an adhesive member.

2. Description of the Related Art

FIG. 4 is a perspective view illustrating the schematic constitution of the conventional displaying apparatus disclosed in the patent document 1 (Japanese Patent Application Laid-Open No. 2003-288028: corresponding to U.S. Pat. No. 7,150,804).

The conventional displaying apparatus illustrated in FIG. 4 includes a displaying panel 1040, and a support member 1042 for supporting the displaying panel 1040. Here, the displaying panel 1040 is manufactured by a transparent glass, acrylic or the like so as to display images. Further, the support member 1042, which is used to compensate the intensity of the displaying panel 1040, has the plate constitution made of, e.g., an aluminum alloy. The displaying panel 1040 and the support member 1042 are adhered to each other by two adhesive members 1041.

These adhesive members 1041 are arranged approximately in parallel on the region extending along the two long edges of the displaying panel 1040, and any adhesive member is not provided on a region 1042a between the two adhesive members 1041.

However, as disclosed in the patent document 1, in the condition that the region close to the outer edge of the displaying panel 1040 is restricted by the adhesive member, there is a possibility that a large stress is generated on the displaying panel 1040 due to a difference between the coefficient of thermal expansion of the displaying panel 1040 and the coefficient of thermal expansion of the support member 1042.

Subsequently, an aspect that the stress is generated on the displaying panel due to the difference between the coefficient of thermal expansion of the displaying panel and the coefficient of thermal expansion of the support member will be described with reference to FIG. 5.

Since the coefficient of thermal expansion of the support member 1042 which consists of the aluminum alloy or the like is larger than the coefficient of thermal expansion of the displaying panel 1040 which has been manufactured by the glass, the acrylic or the like. For this reason, if an environmental temperature is high (in the vicinity of 70° C.) within the range of −20° C. to 70° C., which is the environmental temperature at which the displaying apparatus is actually used, the support member 1042 highly expands as compared with the displaying panel 1040. Thus, as illustrated in FIG. 5A, since a tensile stress is generated on the surface of the displaying panel 1040 to which the support member 1042 has been adhered, the displaying panel 1040 is bent to become convex downward as shown in illustration. On the other hand, if the environmental temperature is low (in the vicinity of −20° C.), the support member 1042 highly contracts as compared with the displaying panel 1040. Thus, as illustrated in FIG. 5B, since a compression stress is generated on the surface of the displaying panel 1040 to which the support member 1042 has been adhered, the displaying panel 1040 is bent to become convex upward as shown in illustration.

In this connection, since the intensity of the material such as the glass, the acrylic or the like constituting the displaying panel 1040 is not so high, it is not preferable that the displaying panel 1040 is bent due to the stress generated as above.

SUMMARY OF THE INVENTION

In consideration of such a conventional problem as described above, the present invention aims to provide a displaying apparatus in which a stress generated on a displaying panel due to a difference between the coefficient of thermal expansion of the displaying panel and the coefficient of thermal expansion of a support member can be reduced.

To achieve such an object, the present invention provides a displaying apparatus which comprises a displaying panel and a support member supporting the displaying panel, and in which the displaying panel and the support member are adhered to each other by an adhesive member, wherein the adhesive member is provided on a central region of the displaying panel, and a cushion material is provided between at least a part of a peripheral of the displaying panel and the support member.

According to the present invention, it is possible to reduce the stress generated on the displaying panel due to the difference between the coefficient of thermal expansion of the displaying panel and the coefficient of thermal expansion of the support member.

Further features of the present invention will become apparent from the following description of the exemplary embodiments with reference to the attached drawings.

BRIEF DESCRIPTION OF THE DRAWINGS

The accompanying drawings, which are incorporated in and constitute a part of the specification, illustrate the exemplary embodiments of the present invention and, together with the description, serve to describe and explain the principle of the present invention.

FIGS. 5A and 5B are cross-sectional views illustrating a state that a stress is generated in the displaying panel due to difference of a thermal expansion coefficient between the displaying panel and the support member.

DESCRIPTION OF THE EMBODIMENTS

Hereinafter, the exemplary embodiments of the present invention will be described with reference to the attached drawings.

Figure 1:
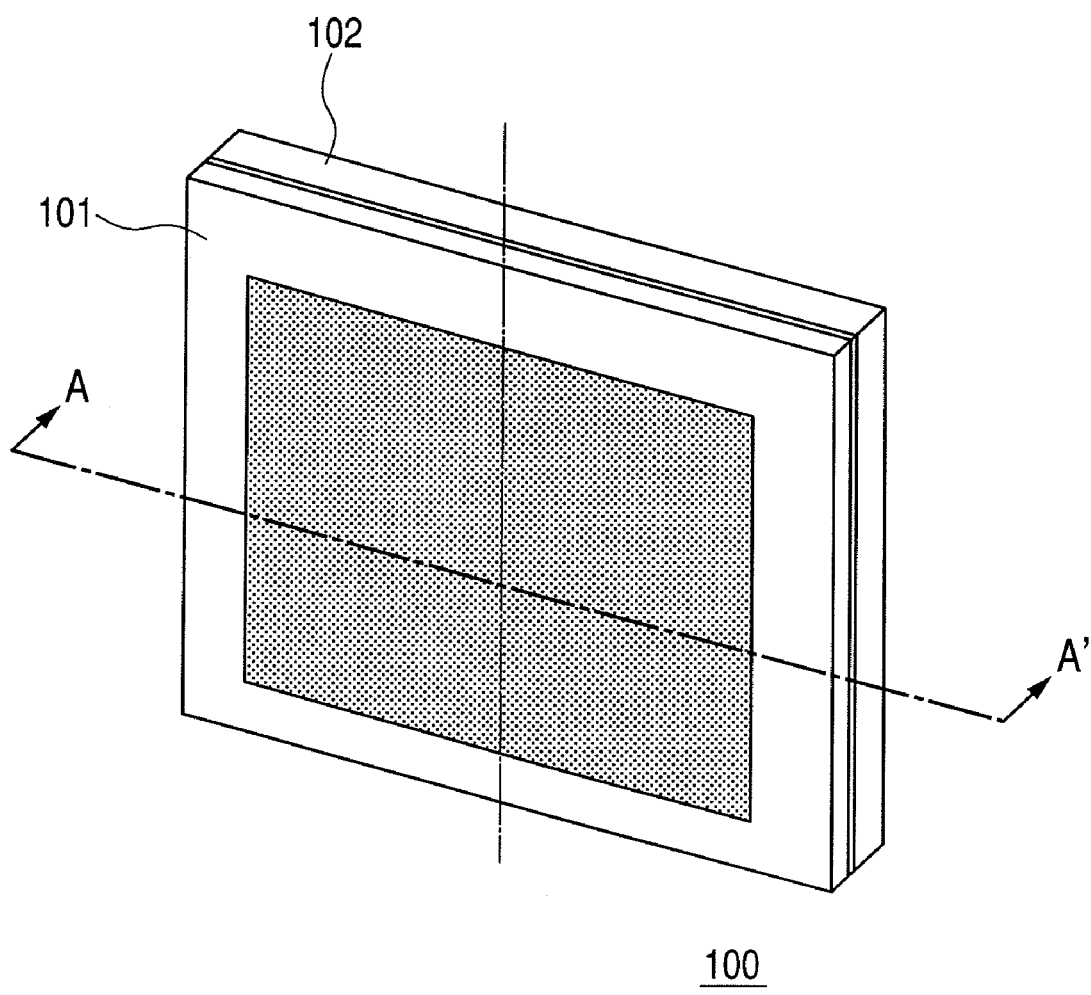
FIG. 1 is a perspective view illustrating a displaying apparatus according to an embodiment of the present invention.
Figure 2A:
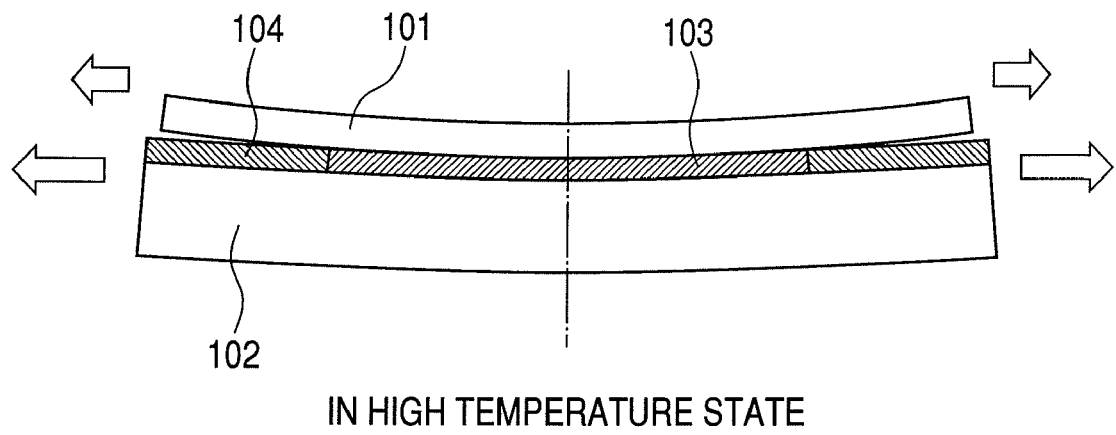
FIGS. 2A and 2B are cross-sectional views drawn along a line A-A' illustrated in FIG. 1 illustrating a state that a stress is generated in a displaying panel due to difference of a thermal expansion coefficient between the displaying panel and a support member.
Figure 2B:
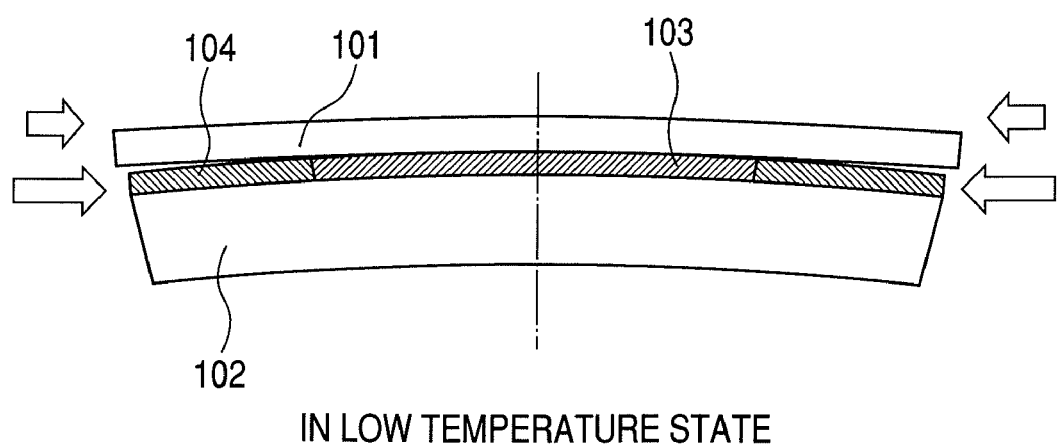

FIG. 1 is a perspective view illustrating a displaying apparatus according to an embodiment of the present invention. FIGS. 2A and 2B are cross-sectional views drawn along a line A-A' illustrated in FIG. 1.

The displaying apparatus of the present embodiment has a displaying panel 101 for displaying images and a support member 102 for supporting the displaying panel 101 on a back side (non-display side) of the displaying panel 101. The displaying panel 101 is fabricated by affixing two glass plates or acrylic plates. The support member 102 can be constituted by an aluminum alloy or a stainless steel.

The displaying panel 101 and the support member 102 are bonded each other by an adhesive member 103 which is provided on a central region of the displaying panel 101. Here, the "central region" means a region of containing a center position where a longitudinal center line and a lateral center line on a plane of the displaying panel 101 are intersected. The central region of the displaying panel 101 is narrower than a whole area of the displaying panel 101, and an external margin of the central region is positioned more center side of the displaying panel 101 than an external margin of the displaying panel 101. As the adhesive member 103, a silicone adhesive, an acrylic adhesive, an epoxy adhesive or a double-stick tape can be used.

The weight per unit area of the displaying panel 101 is in a range from 3.5 kg/m$^2$ to 100 kg/m$^2$. On the other hand, the shear strength of the adhesive member 103 constituted by the silicone adhesive, the acrylic adhesive, the epoxy adhesive or the double-stick tape is in a range from 0.5 N/mm$^2$ (initial adhesivity of the silicone adhesive) to 30 N/mm$^2$. Therefore, in case of using the acrylic adhesive having the high adhesivity as the adhesive member 103, if an adhered area which covers about 0.02% of a back side area of the displaying panel 101 is secured, a load of the displaying panel 101 can be sufficiently supported.

As for the displaying apparatus of the present embodiment, a cushion material 104 is arranged on at least a part in a peripheral of the displaying panel 101 and a region between the displaying panel 101 and the support member 102. The cushion material 104 may be provided on a whole area of the peripheral of the displaying panel 101 or may be provided on part areas (e.g., four corners of the displaying panel 101) of the peripheral. Here, the "peripheral" means a region between a central region of the displaying panel 101 and an external margin of the displaying panel 101. The cushion material 104 plugs a gap between the displaying panel 101 which is formed on the peripheral and the support member 102. According to this constitution, even if any force is applied to a part of the peripheral of the displaying panel 101, the cushion material 104 has a function of preventing that the aforementioned part of the displaying panel 101 contacts with the support member 102.

The cushion material 104 is constituted by, for example, a flexible gel material, of which a main raw material is silicone, or a spongy elastic material such as a urethane sponge. The cushion material 104 may be fixed to either the displaying panel 101 or the support member 102 or may be fixed to both the displaying panel 101 and the support member 102, or may be in a state of only nipped between the displaying panel 101 and the support member 102 which are bonded by the adhesive member 103. In a case that the cushion material 104 is fixed to either the displaying panel 101 or the support member 102, the cushion material 104 may contact with the other displaying panel 101 or the other support member 102 to which the cushion material is not fixed, or a gap may be formed so as not to contact with the other displaying panel 101 and the other support member 102.

In any case, the displaying panel 101 and the support member 102 are in a state of not bound to each other in the peripheral. In a case that the cushion material is fixed to either the displaying panel 101 or the support member 102, or in a case that the cushion material 104 is only nipped between the displaying panel 101 and the support member 102, the displaying panel 101 and the support member 102 can be relatively moved freely. In addition, even if in a case that the cushion material 104 is fixed to both the displaying panel 101 and the support member 102, since the cushion material 104 constituted by the above-mentioned material can be easily deformed, the displaying panel 101 and the support member 102 can be relatively moved freely.

As just described, in the present embodiment, only a central region of the displaying panel 101 is fixed to the support member 102 by the adhesive member 103, and the peripheral of the displaying panel 101 is not fixed to the support member 102 by the adhesive member 103. Therefore, the displaying panel 101 and the support member 102 can be relatively moved in the peripheral of the displaying panel 101. According to this constitution, a stress generating portion in the displaying panel 101 can be minimized within the central region where the support member 102 was fixed by the adhesive member 103. As a result, the stress to be generated in the displaying panel 101 can be reduced. In addition, since the displaying panel 101 and the support member 102 can be relatively moved in the peripheral of the displaying panel 101, the stress generated in the central region can be released (dispersed) by this peripheral.

Next, a state that the stress is generated in the displaying panel due to difference of a thermal expansion coefficient between the displaying panel and the support member will be described with reference to FIGS. 2A and 2B.

A thermal expansion coefficient of the displaying panel 101 fabricated by a glass material or an acrylic material is in a range from about $4 \times 10^{-6}$ to $90 \times 10^{-6}$, and a thermal expansion coefficient of the support member 102 fabricated by the aluminum alloy is about $24 \times 10^{-6}$.

In a conventional technology characterized in that a peripheral of a displaying panel is fixed, when the environmental temperature is a high temperature (about 70° C.), the support member having a large thermal expansion coefficient expands more largely than the displaying panel having a small thermal expansion coefficient as described above by illustrating in FIG. 5A. According to this fact, a large tensile stress is generated on a plane where the support member of the displaying panel is bonded. When the environmental temperature is a low temperature (about −20° C.), the support member contracts more largely than the displaying panel, and a large compression stress is generated on a plane where the support member of the displaying panel is bonded.

Compared with this, in the present embodiment, the adhesive member 103 is applied to only the central region of the displaying panel 101 as illustrated in FIGS. 2A and 2B, and the displaying panel 101 is not bound by the support member 102 in the peripheral of the central region. Therefore, since length of a binding portion of both the displaying panel and the support member for generating difference of thermal expansion amount between the displaying panel 101 and the support member 102 is shortened as compared with a conventional case, the stress to be generated in the support member 102 can be reduced also in any case when the temperature is a high temperature (FIG. 2A) and a low temperature (FIG. 2B).

Figure 3:
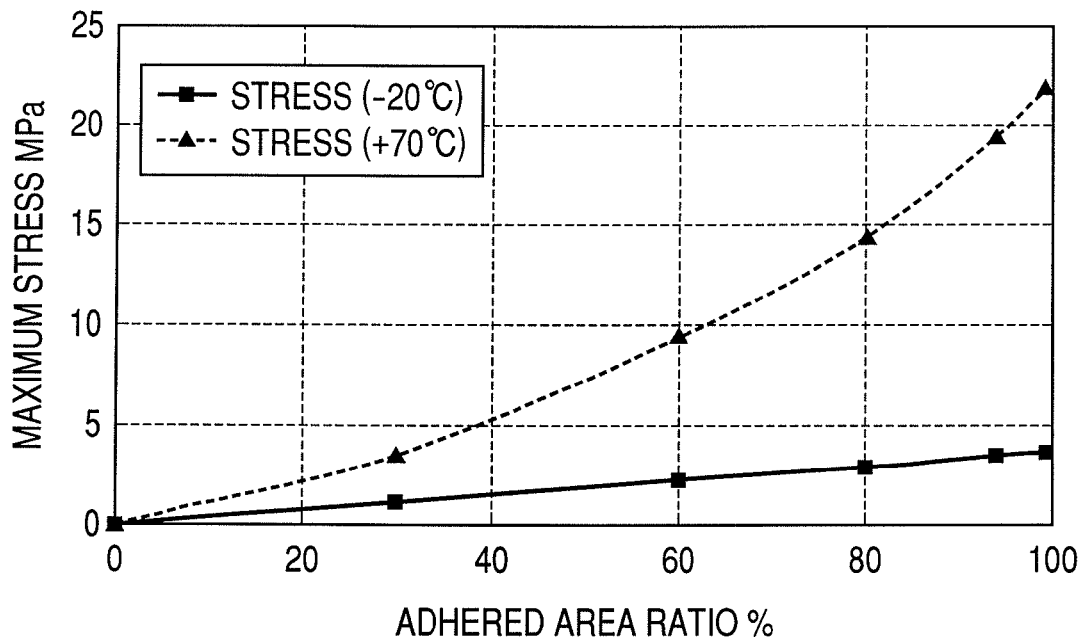
FIG. 3 is a graph illustrating an experimental value of indicating a relationship between an adhered area ratio of the displaying panel and the stress to be generated in the displaying panel when a use environment of the displaying apparatus illustrated in FIG. 1 is in a high temperature (70° C.) state and a low temperature (−20° C.) state.
Figure 4:
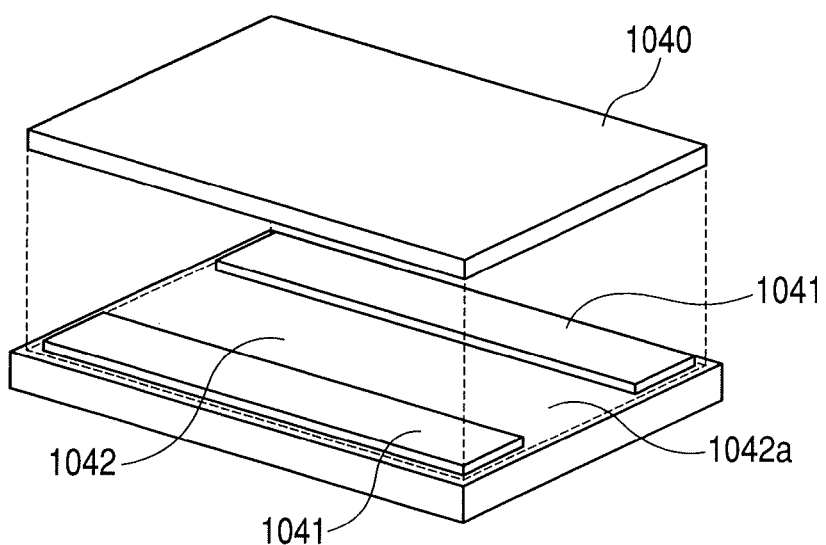
FIG. 4 is a perspective view illustrating schematic constitution of a conventional displaying apparatus.

FIG. 3 is a graph illustrating an experimental value of indicating a relationship between an adhered area ratio of the displaying panel and the stress to be generated in the displaying panel when a use environment of the displaying apparatus illustrated in FIG. 1 is in a high temperature (70° C.) state and a low temperature (−20° C.) state. The following fact can be disclosed judging from FIG. 3.

In a case that the stress to be generated in the displaying panel 101 in the each use environment is treated as a reference stress when an adhered area ratio for a whole area of the displaying panel 101 is equal to 100%, in order to reduce the stress to be generated in the displaying panel to become less than a half of that reference stress, the following condition is required. That is, it is required that the adhered area ratio for the whole area of the displaying panel is suppressed to become less than 50% after setting that an adhered region of the displaying panel is only equivalent to the central region as described above. Accordingly, the stress to be generated in the displaying panel 101 in the each use environment can be suppressed to become less than a half of the reference stress in a low temperature (−20° C.) state and can be suppressed to become less than a third part of the reference stress in a high temperature (70° C.) state. In this manner, according to the displaying apparatus of the present embodiment, the stress to be generated in the displaying panel 101 due to difference of a thermal expansion ratio between the displaying panel 101 and the support member 102 can be reduced.

While the present invention has been described with reference to the exemplary embodiments, it is to be understood that the present invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-059477, filed Mar. 10, 2008, which is hereby incorporated by reference herein in its entirety.

What is claimed is:

1. A displaying apparatus comprising:
   a displaying panel having a back side plane, wherein said back side plane comprises a central region including a center position of the back side plane and a peripheral region on either side of the central region;
   a support member supporting the displaying panel by having a first portion opposing the central region and a second portion opposing the peripheral region, with a thermal expansion coefficient of the support member being higher than a thermal expansion coefficient of the display panel;
   an adhesive member provided between the displaying panel and the support member, the back side plane being bonded to the support member by the adhesive member, and
   a deformable cushion material fixed to one of the peripheral region or the second portion,
   wherein the back side plane of the displaying panel is bonded to the first portion by the adhesive member only at its central region, and the displaying panel and the support member are unconstrained from each other in the peripheral region such that the deformable cushion material can be spaced apart from the other of the peripheral region or the second portion when the thermal expansion amount of the support member is smaller than that of the displaying panel.

2. A displaying apparatus according to claim 1, wherein the deformable cushion material is fixed to at least one of the displaying panel and the support member.

3. A displaying apparatus according to claim 1, wherein the deformable cushion material includes a gel material.

4. A displaying apparatus according to claim 1, wherein the deformable cushion material includes a spongy elastic material.

5. A displaying apparatus according to claim 1, wherein an area where the adhesive member is bonded is less than 50% of an entire area of the plane.

6. A displaying apparatus according to claim 1, with a shear strength of the adhesive member being in a range from 0.5 $N/mm^2$ to 30 $N/mm^2$.

7. A displaying apparatus according to claim 6, wherein the adhesive member is a silicone adhesive, an acrylic adhesive, or an epoxy adhesive.

8. A displaying apparatus according to claim 6, wherein the adhesive member is a silicone adhesive.

9. A displaying apparatus according to claim 1, wherein the deformable cushion material is provided at corner regions of the peripheral region.

10. A displaying apparatus comprising:
    a displaying panel having a back side plane, wherein said back side plane comprises a central region including a center position of the back side plane and peripheral regions;
    a support member supporting the displaying panel by having a first portion opposing the central region and a second portion opposing the peripheral regions, with a thermal expansion coefficient of the support member being higher than a thermal expansion coefficient of the display panel;
    an adhesive member provided between the displaying panel and the support member, the back side plane being bonded to the support member by the adhesive member, and
    a deformable cushion material fixed to one of the peripheral regions or the second portion,
    wherein the back side plane of the displaying panel is bonded to the first portion by the adhesive member only at its central region, and the displaying panel and the support member are unconstrained from each other in the peripheral regions such that the peripheral regions and the second portion can be separated from each other.

11. A displaying apparatus according to claim 10, wherein the deformable cushion material is fixed to at least one of the displaying panel and the support member.

12. A displaying apparatus according to claim 10, wherein the deformable cushion material includes a gel material.

13. A displaying apparatus according to claim 10, wherein the deformable cushion material includes a spongy elastic material.

14. A displaying apparatus according to claim 10, wherein an area where the adhesive member is bonded is less than 50% of an entire area of the back side plane.

15. A displaying apparatus according to claim 10, with a shear strength of the adhesive member being in a range from 0.5 $N/mm^2$ to 30 $N/mm^2$.

16. A displaying apparatus according to claim 15, wherein the adhesive member is a silicone adhesive, an acrylic adhesive, or an epoxy adhesive.

17. A displaying apparatus according to claim 15, wherein the adhesive member is a silicone adhesive.

18. A displaying according to claim 10, wherein the deformable cushion material is provided at corner regions of the peripheral regions.

* * * * *